(12) United States Patent
Xiao et al.

(10) Patent No.: US 11,360,357 B2
(45) Date of Patent: Jun. 14, 2022

(54) DISPLAY SUBSTRATE AND MANUFACTURING METHOD THEREOF, DISPLAY DEVICE

(71) Applicants: BEIJING BOE DISPLAY TECHNOLOGY CO., LTD., Beijing (CN); BOE TECHNOLOGY GROUP CO., LTD., Beijing (CN)

(72) Inventors: Wenjun Xiao, Beijing (CN); Shijun Wang, Beijing (CN); Hehe Hu, Beijing (CN); Haoliang Zheng, Beijing (CN); Xi Chen, Beijing (CN); Xiaochuan Chen, Beijing (CN); Guangcai Yuan, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/639,786

(22) PCT Filed: Jan. 3, 2019

(86) PCT No.: PCT/CN2019/070243
§ 371 (c)(1),
(2) Date: Feb. 18, 2020

(87) PCT Pub. No.: WO2020/140232
PCT Pub. Date: Jul. 9, 2020

(65) Prior Publication Data
US 2021/0132428 A1  May 6, 2021

(51) Int. Cl.
*G02F 1/1343* (2006.01)
*G02F 1/1362* (2006.01)
(Continued)

(52) U.S. Cl.
CPC ........ *G02F 1/13439* (2013.01); *G02F 1/1368* (2013.01); *G02F 1/134318* (2021.01);
(Continued)

(58) Field of Classification Search
CPC .................................................. G02F 1/13439
See application file for complete search history.

(56) References Cited

U.S. PATENT DOCUMENTS 7,264,981 B2  9/2007 Kim
9,627,461 B2  4/2017 Xie
(Continued)

FOREIGN PATENT DOCUMENTS

CN    1381899    11/2002
CN    103943636   7/2014
(Continued)

*Primary Examiner* — Alexander P Gross
(74) *Attorney, Agent, or Firm* — Leason Ellis LLP

(57) ABSTRACT

A display substrate and a manufacturing method thereof and a display device are disclosed. The manufacturing method of the display substrate includes: forming a first display electrode; and forming a thin film transistor, which includes forming a semiconductor layer; The first display electrode and the semiconductor layer are in one same layer, and a step of forming the first display electrode is performed before performing a step of forming the semiconductor layer.

9 Claims, 12 Drawing Sheets

(51) Int. Cl.
*G02F 1/1368* (2006.01)
*H01L 27/12* (2006.01)

(52) U.S. Cl.
CPC .. *G02F 1/134363* (2013.01); *G02F 1/136295* (2021.01); *H01L 27/1259* (2013.01)

(56) References Cited

U.S. PATENT DOCUMENTS

| | | | |
|---|---|---|---|
| 10,388,672 B2 | 8/2019 | Zhang et al. | |
| 2003/0184688 A1* | 10/2003 | Kim | G02F 1/13439 349/43 |
| 2005/0030461 A1* | 2/2005 | Ono | G02F 1/1368 349/141 |
| 2005/0139836 A1* | 6/2005 | Oh | H01L 29/458 257/72 |
| 2008/0121875 A1* | 5/2008 | Kim | H01L 51/052 257/40 |
| 2013/0162926 A1* | 6/2013 | Kwack | H01L 27/1288 349/43 |
| 2018/0308607 A1* | 10/2018 | Alford | H01L 31/1884 |
| 2019/0072797 A1* | 3/2019 | Hirano | H01L 27/1288 |

FOREIGN PATENT DOCUMENTS

| | | |
|---|---|---|
| CN | 104362125 | 2/2015 |
| CN | 104934448 | 9/2015 |
| WO | WO-2017158967 A1 * | 9/2017 ......... H01L 21/8236 |

* cited by examiner

DISPLAY SUBSTRATE AND MANUFACTURING METHOD THEREOF, DISPLAY DEVICE

CROSS-REFERENCE TO RELATED PATENT APPLICATIONS

This application is a U.S. National Stage Application under 35 U.S.C. § 371 of International Patent Application No. PCT/CN2019/070243, filed Jan. 3, 2019, which is incorporated by reference in its entirety.

TECHNICAL FIELD

At least one embodiment of the present disclosure relates to a display substrate and a manufacturing method thereof, and a display device.

BACKGROUND

At present, during fabricating a display substrate for a liquid crystal display device, it is usually necessary to form a thin film transistor and a display electrode. Generally, after forming a semiconductor layer of the thin film transistor, in order to prevent the subsequent formation process of the display electrode from causing damage to a surface of the semiconductor layer, a protection layer covering the semiconductor layer is formed, and then other structures such as the display electrode are formed.

SUMMARY

At least one embodiment of the present disclosure provides a manufacturing method of a display substrate, and the method comprises: forming a first display electrode; and forming a thin film transistor, which comprises forming a semiconductor layer. The first display electrode and the semiconductor layer are in one same layer, and a step of forming the first display electrode is performed before performing a step of forming the semiconductor layer.

For example, in the manufacturing method of the display substrate provided by at least one embodiment of the present disclosure, a step of forming the semiconductor layer comprises: forming a semiconductor material layer, in which the semiconductor material layer and the first display electrode are in one same layer; and performing a patterning process on the semiconductor material layer to form the semiconductor layer.

For example, in the manufacturing method of the display substrate provided by at least one embodiment of the present disclosure, a laser annealing treatment is performed on the first display electrode before forming the semiconductor material layer.

For example, in the manufacturing method of the display substrate provided by at least one embodiment of the present disclosure, a material of the semiconductor layer is metal oxide, and a material of the first display electrode is transparent metal oxide.

For example, in the manufacturing method of the display substrate provided by at least one embodiment of the present disclosure, a step of forming the first display electrode comprises: forming a first conductive material layer; and performing a patterning process on the first conductive material layer so as to form the first display electrode. During performing a patterning process on the first conductive material layer, a wet etching method is adopted to etch the first conductive material layer so as to form the first display electrode; during performing the patterning process on the semiconductor material layer, a wet etching method is adopted to etch the semiconductor material layer so as to form the semiconductor layer.

For example, the manufacturing method of the display substrate provided by at least one embodiment of the present disclosure further comprises: forming a source electrode and a drain electrode of the thin film transistor, in which the source electrode and the drain electrode are respectively electrically connected to the semiconductor layer; forming a first insulation layer, in which the first insulation layer covers the source electrode, the drain electrode, the semiconductor layer and the first display electrode, and the first insulation layer is in direct contact with each one selected from a group consisting of the semiconductor layer, the drain electrode and the first display electrode; and forming a second display electrode on the first insulation layer.

For example, the manufacturing method of the display substrate provided by at least one embodiment of the present disclosure further comprises: forming a data line, in which the data line is electrically connected to the source electrode and is in one same layer with the source electrode; and the second display electrode covers at least a portion of the data line.

For example, in the manufacturing method of the display substrate provided by at least one embodiment of the present disclosure, the second display electrode is a slit electrode, and the first display electrode is a plate electrode.

For example, in the manufacturing method of the display substrate provided by at least one embodiment of the present disclosure, the first display electrode is a pixel electrode, and the second display electrode is a common electrode; and a step of forming the source electrode of the thin film transistor and the drain electrode of the thin film transistor comprises: forming a source-drain conductive material layer; and performing a patterning process on the source-drain conductive material layer so as to form the source electrode and the drain electrode, in which a portion of the pixel electrode and a portion of the drain electrode are stacked with each other so that the pixel electrode and the drain electrode are in direct contact with each other.

For example, in the manufacturing method of the display substrate provided by at least one embodiment of the present disclosure, the first display electrode is a common electrode, and the second display electrode is a pixel electrode; a step of forming the source electrode of the thin film transistor and the drain electrode of the thin film transistor comprises: forming a source-drain conductive material layer; and performing a patterning process on the source-drain conductive material layer so as to form the source electrode and the drain electrode, in which the common electrode and the drain electrode are spaced apart from each other; and the manufacturing method of the display substrate further comprises: patterning the first insulation layer so as to form a via hole exposing the drain electrode, in which the pixel electrode is electrically connected to the drain electrode through the via hole.

For example, in the manufacturing method of the display substrate provided by at least one embodiment of the present disclosure, a step of forming the source electrode of the thin film transistor and the drain electrode of the thin film transistor is performed after the step of forming the semiconductor layer, the source electrode covers a respectively and the drain electrode covers a portion of the semiconductor layer; or, the step of forming the source electrode of the thin film transistor and the drain electrode of the thin film transistor is performed before performing the step of forming the semiconductor layer, and the semiconductor layer covers a portion of the source electrode and a portion of the drain electrode.

For example, the manufacturing method of the display substrate provided by at least one embodiment of the present disclosure further comprises: forming a second insulation layer. Both the first display electrode and the semiconductor layer are formed on the second insulation layer, and are in direct contact with the second insulation layer.

At least one embodiment of the present disclosure further provides a display substrate fabricated by any one of the manufacturing methods provided by an embodiment of the present disclosure.

For example, the display substrate provided by at least one embodiment of the present disclosure further comprises: a source electrode and a drain electrode of the thin film transistor, a first insulation layer and the second display electrode. The source electrode and the drain electrode are respectively electrically connected to the semiconductor layer; the first insulation layer covers the source electrode, the drain electrode, the semiconductor layer and the first display electrode, and the first insulation layer is in direct contact with each one selected from a group consisting of the semiconductor layer, the drain electrode and the first display electrode; and the second display electrode is on the first insulation layer.

For example, in the display substrate provided by at least one embodiment of the present disclosure, a material of the semiconductor layer is metal oxide, and a material of the first display electrode is transparent metal oxide.

For example, in the display substrate provided by at least one embodiment of the present disclosure, the source electrode covers a portion of the semiconductor layer, and the drain electrode covers a portion of the semiconductor layer; or the semiconductor layer covers a portion of the source electrode and a portion of the drain electrode.

For example, in the display substrate provided by at least one embodiment of the present disclosure, the first display electrode is a pixel electrode, the second display electrode is a common electrode, and the pixel electrode and the drain electrode are stacked with each other so that the pixel electrode is in direct contact with the drain electrode; or, the first display electrode is a common electrode, the second display electrode is a pixel electrode, the common electrode and the drain electrode are spaced apart, the first insulation layer comprises a via hole exposing the drain electrode, and the pixel electrode is electrically connected to the drain electrode through the via hole.

For example, the display substrate provided by at least one embodiment of the present disclosure further comprises: a data line that is electrically connected to and in one same layer with the source electrode. The second display electrode covers at least a portion of the data line.

For example, in the display substrate provided by at least one embodiment of the present disclosure, the second display electrode is a slit electrode, and the first display electrode is a plate electrode.

At least one embodiment of the present disclosure further provides a display device, and the display device comprises any one of the display substrates provided by an embodiment of the present disclosure.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1A:
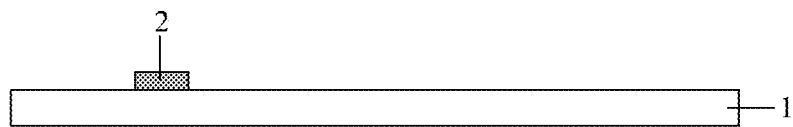
FIGS. 1A-1K are schematic diagrams of a manufacturing method of a display substrate provided by an embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "Inside," "outside," "on," "under" and the like are only used to indicate relative position relationship, and when the position of the object which is described is changed, the relative position relationship may be changed accordingly.

The drawings used in the present disclosure are not strictly draw to actual scale, and the specific size and quantity of each structure may be determined according to actual needs. The drawings described in the present disclosure are only schematically structural diagrams. It should be noted that, in the present disclosure, a structure A and a structure B are in one same layer means that: at least part of a surface of the structure A facing the base substrate 1 and a surface of the structure B facing the base substrate 1 are in contact with a same film layer, and in a direction perpendicular to the base substrate, no layer or structure is between at least a portion of the structure A and the structure B.

At least one embodiment of the present disclosure provides a manufacturing method of a display substrate, and the method comprises: forming a first display electrode; and forming a thin film transistor, which comprises forming a semiconductor layer. The first display electrode and the semiconductor layer are in one same layer, and a step of forming the first display electrode is performed before performing a step of forming the semiconductor layer.

Exemplarily, FIGS. 1A-1K are schematic diagrams of a manufacturing method of a display substrate provided by an embodiment of the present disclosure, and the manufacturing method of the display substrate comprises forming a thin film transistor. The step of forming of the thin film transistor comprises forming a gate electrode, forming a semiconductor layer, and forming a source electrode and a drain electrode.

For example, as illustrated in FIG. 1A, a base substrate 1 is provided. For example, the base substrate 1 may be a quartz substrate, a glass substrate or an organic substrate. A gate electrode 2 is formed on base substrate 1. For example, the gate electrode 2 is formed by a patterning process.

Figure 1B:
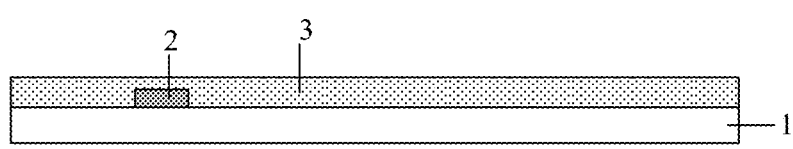

As illustrated in FIG. 1B, a gate insulation layer 3 covering the gate electrode is formed. For example, the gate insulation layer 3 is formed by a coating method. For example, a material of the gate insulation layer 3 is an inorganic insulation material (for example, silicon oxide, silicon nitride or silicon oxynitride, etc.) or an organic insulation material (for example, an insulation resin material).

In an embodiment of the present disclosure, the first display electrode and the semiconductor layer are in one same layer, the step of forming the first display electrode is performed before performing the step of forming the semiconductor layer. For example, the semiconductor layer and the first display electrode are formed on the gate insulation layer 3, and the semiconductor layer and the first display electrode are respectively in direct contact with the gate insulation layer 3.

Figure 1C:
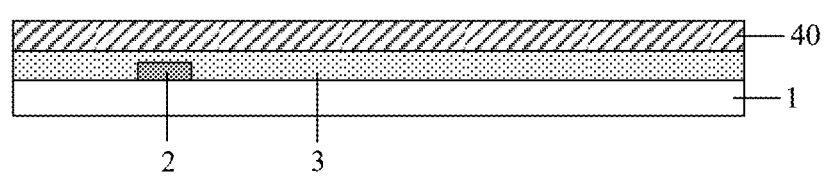

As illustrated in FIG. 1C, a step of forming the first display electrode comprises: forming a first conductive material layer 40. The first conductive material layer 40 covers at least a portion of the gate insulation layer 3.

Figure 1D:
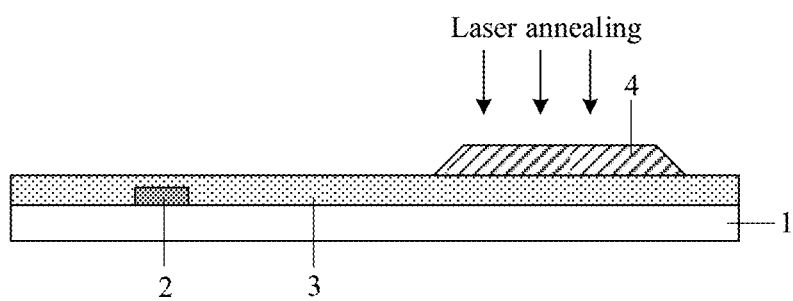

As illustrated in FIG. 1D, forming the first display electrode further comprises: performing a patterning process on the first conductive material layer 40 so as to form the first display electrode 4. The first display electrode 4 is on the gate insulation layer 3 and in contact with the gate insulation layer 3. For example, during performing a patterning process on the first conductive material layer 40, a wet etching method is adopted to etch the first conductive material layer 40 so as to form the first display electrode 4.

For example, a material of the first display electrode 4 is transparent metal oxide. The transparent metal oxide is indium tin oxide (ITO), indium zinc oxide (IZO), etc. For example, an etching solution for etching the metal oxide usually comprises sulfuric acid and nitric acid. Of course, the material of the first display electrode 4 is not limited to the cases listed above.

Figure 1E:
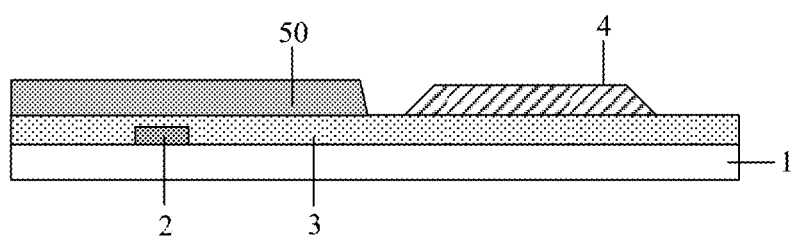
Figure 1F:
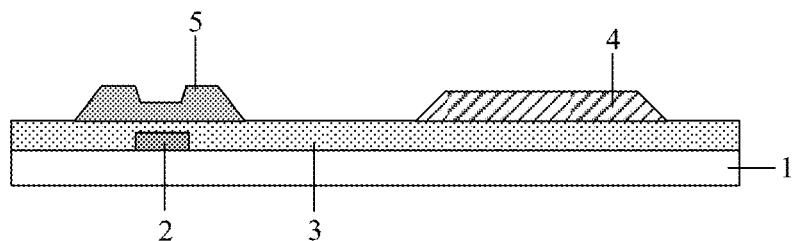

In the manufacturing method of the display substrate provided by an embodiment of the present disclosure, the semiconductor layer is formed after forming the first display electrode 4. Forming the semiconductor layer comprises: forming a semiconductor material layer 50 (as illustrated in FIG. 1E), and performing a patterning process on the semiconductor material layer 50 so as to form the semiconductor layer 5 (as illustrated in FIG. 1F). The semiconductor material layer 50 and the first display electrode 4 are in one same layer, so that the semiconductor layer 50 and the first display electrode 4 are in one same layer. It should be noted that, in an embodiment of the present disclosure, the semiconductor material layer 50 and the first display electrode 4 are in one same layer means that: at least part of the surface of the semiconductor material layer 50 facing the base substrate 1 and the surface of the first display electrode 4 facing the base substrate 1 are in contact with a same film layer, and no other layer is between the first display electrode 4 and the at least part of the semiconductor material layer 50 in the direction perpendicular to the base substrate 1.

For example, a material of the semiconductor layer 5 is metal oxide (i.e., the material of the semiconductor material layer 50 is metal oxide). The metal oxide is, for example, indium gallium zinc oxide (IGZO), for example, indium gallium zinc amorphous oxide. The carrier mobility of IGZO is 20-30 times of the carrier mobility of amorphous silicon, so that in the display panel (for example, a liquid crystal display panel) including the display substrate, charging and discharging rates of the thin film transistor to a pixel electrode are increased, so that a response speed of a pixel is increased; meanwhile, a power consumption of the liquid crystal display panel fabricated with the substrate is reduced (the power consumption of the liquid crystal display panel is close to that of an OLED display panel). And, the semiconductor layer may comprise a metal oxide layer only, and does not comprise a doping layer, so that the manufacturing process of the display substrate is further simplified, and a manufacturing cost of the display substrate is further reduced, and a thickness of the display substrate is relatively small. The thickness of the liquid crystal display panel is smaller than that of a usual liquid crystal panel, for example, the thickness is only approximately 25% higher compared with an OLED display panel. Furthermore, the resolution of the liquid crystal display panel can reach full HD (1920× 1200) or ultra definition (3840×2160).

For example, during performing a patterning process on the semiconductor material layer 50, a wet etching method is adopted to etch the semiconductor material layer 50, so as to form the semiconductor layer 5. The etching solution for etching the metal oxide generally comprises sulphuric acid and nitric acid.

The semiconductor layer 5 and the first display electrode 4 formed by the above-mentioned method are in one same layer. It should be noted that, in an embodiment of the present disclosure, the semiconductor layer 5 and the first display electrode 4 are in one same layer means that: at least part of the surface of the semiconductor layer 5 facing the base substrate 1 and the surface of the first display electrode 4 facing the base substrate 1 are in contact with a same film layer, for example, in contact with the gate insulation layer 3, and, in the direction perpendicular to the base substrate 1, no other layer is between the first display electrode 4 and the at least part of the semiconductor layer 5. The other layer is, for example, an insulation layer covering the semiconductor layer 5, or, an insulation layer covering the first display electrode 4. In the manufacturing method of the display substrate provided by an embodiment of the present disclosure, because the semiconductor layer 5 and the first display electrode 4 to be in one same layer, it not necessary to form a protection layer covering the semiconductor layer after the semiconductor layer is formed to protect the semiconductor layer and then to form the first display electrode on the protection layer, so that both the manufacturing process and the structure of the display substrate are simplified.

In the case where the semiconductor layer 5 and the first display electrode 4 are in one same layer and both the material of the first display electrode 4 and the material of the semiconductor layer 5 are metal oxide, because the etching solution for etching metal oxide generally comprises sulphuric acid and nitric acid, if the semiconductor layer first is formed first, then a first conductive material layer which covers the semiconductor layer and is in contact with the semiconductor layer is later, and then the first display electrode is formed by etching the first conductive material layer with a wet etching method, the etching solution for etching the first conductive material layer can react with the semiconductor layer, so that part of the semiconductor layer is dissolved, that is, it is easy to cause an over etching phenomenon, and the performance of the semiconductor layer is adversely affected, this causes the performance of the thin film transistor to be unstable, so that the display effect of the display substrate is adversely affected. However, in at least one embodiment of the present disclosure, because the step of forming the first display electrode 4 is performed before performing the step of forming the semiconductor layer 5, the semiconductor layer 5 is formed by performing the wet etching on the semiconductor material layer 50 which covers the first display electrode 4 and is in contact with the first display electrode 4 after the first display electrode 4 is formed, so that the over etching phenomenon of the semiconductor layer is avoided while simplifying the manufacturing process of the display substrate. During performing the wet etching on the semiconductor material layer 50, minor etching may occur at a surface of the first display electrode 4, however, the minor etching only slightly affects the morphology of the surface of the first display electrode 4 and has almost no impact on the performance of the first display electrode 4. Furthermore, compared with the impact of over etching of the surface of the semiconductor layer on the display function of the substrate, the impact of over etching of the surface of the first display electrode 4 on the display function of the substrate is much smaller in the manufacturing method of the display substrate provided by an embodiment of the present disclosure.

For example, as illustrated in FIG. 1D, before forming the semiconductor material layer, a laser annealing treatment is performed on the first display electrode 4, so that the surface of the first display electrode 4 is crystallized. During forming the semiconductor layer 5 by the wet etching method subsequently, the surface of crystallized first display electrode 4 is not easily corroded by the etching solution for etching the semiconductor material layer 50, so that the over etching of the first display electrode 4 can be avoided.

Figure 1G:
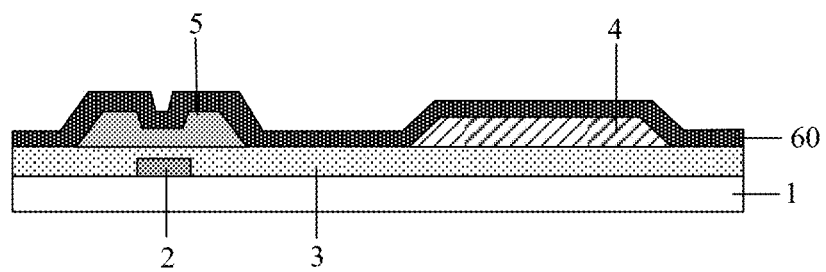
Figure 1H:
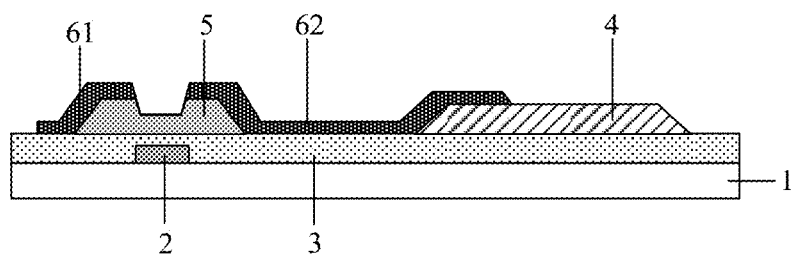

The manufacturing method of the display substrate further comprises: forming the source electrode and the drain electrode of the thin film transistor, forming a first insulation layer, and forming a second display electrode on the first insulation layer. For example, the first display electrode is a pixel electrode, and the second display electrode is a common electrode. In this case, forming the source electrode and the drain electrode of the thin film transistor comprises: forming a source-drain conductive material layer 60, as illustrated in FIG. 1G; performing a patterning process on the source-drain conductive material layer 60 so as to form the source electrode 61 and the drain electrode 62, as illustrated in FIG. 1H. The source electrode 61 and the drain electrode 62 are respectively in contact with the semiconductor layer 5, so that the source electrode 61 and the drain electrode 62 are respectively electrically connected to the semiconductor layer 5. The pixel electrode (i.e., the first display electrode 4) and the drain electrode 62 are stacked with each other, so that the pixel electrode is in direct contact with the drain electrode 62, which reduces the contact resistance between the pixel electrode and the drain electrode 62.

Figure 1I:
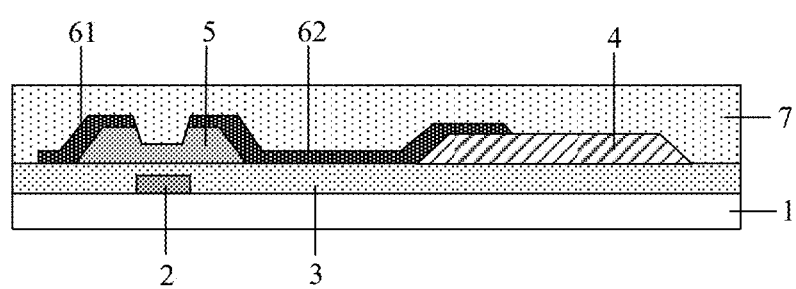

As illustrated in FIG. 1I, the first insulation layer 7 is formed and the first insulation layer 7 covers the source electrode 61, the drain electrode 62, the semiconductor layer 5 and the first display electrode 4, and the first insulation layer 7 is in direct contact with each one selected from a group consisting of the semiconductor layer 5, the drain electrode 62 and the first display electrode 4.

Figure 1J:
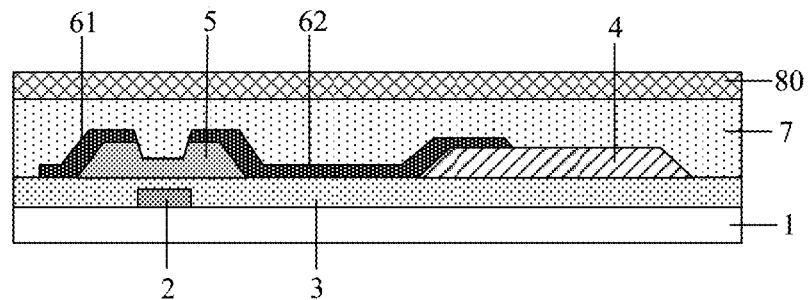
Figure 1K:
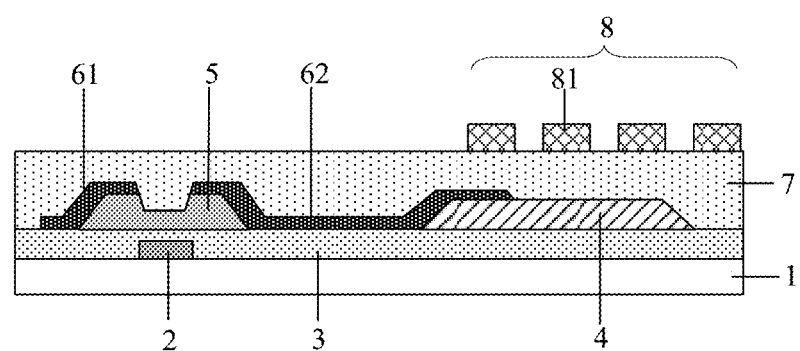

As illustrated in FIG. 1J, a second conductive material layer 80 covering the first insulation layer 7 is formed. A second display electrode 8 is formed by performing a patterning process on the second conductive material layer 80, so that the display substrate as illustrated in FIG. 1K is formed.

For example, the second display electrode 8 is a slit electrode, and the first display electrode 4 is a plate electrode. The second display electrode 8 comprises a plurality of portions 81, and the plurality of portions 81 are spaced apart from each other; a slit is formed between adjacent portions of the plurality of portions 81. The electric field generated at an edge of the slit electrode and the electric field generated between the slit electrode and the plate electrode can form a multidimensional electric field. When using the display substrate to fabricate and obtain a liquid crystal panel, liquid crystal molecules, with all kinds of orientation, which are between the slit electrodes and right above the electrode are allowed to rotate, so that a working efficiency of the liquid crystal and a light transmission efficiency are increased.

For example, the manufacturing method of the display substrate further comprises: forming a second insulation layer. Both the first display electrode 4 and the semiconductor layer are formed on the second insulation layer and are in contact with the second insulation layer. In the embodiment as illustrated in FIGS. 1A-1K, the second insulation layer is the gate insulation layer 3.

Figure 5:
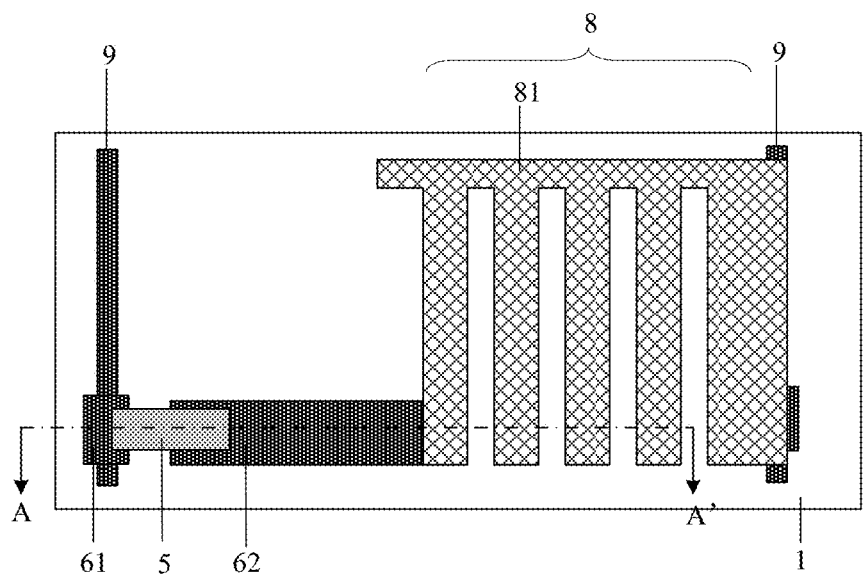
FIG. 5 is a plan view of a display substrate fabricated by a manufacturing method of a display substrate provided by an embodiment of the present disclosure.

FIG. 5 is a schematically plan view of the display substrate fabricated by the manufacturing method of the display substrate provided by an embodiment of the present disclosure. As illustrated in FIG. 5, for example, the manufacturing method of the display substrate further comprises: forming a data line 9 which is electrically connected to the source electrode 61 and is in one same layer with the source electrode 61. The second display electrode 8 covers part of the data line 9. For example, the second display electrode 8 cover an entirety of a width of the data line 9 along a width direction (which is perpendicular to an extension direction of the data line 9) of the data line 9. When using the display substrate to fabricate and form a liquid crystal display panel, because the second display electrode 8 covers part of the data line 9, so that interferential electric field generated by charges on the data line can be shielded, in which the interferential electric field can cause interference to the rotation of the liquid crystal. Generally, a black matrix covering the data line is provided in the liquid crystal display panel. The black matrix not only can block light, but also can shield the above-mentioned interferential electric field. Because the second display electrode covers at least part of the data line, the issue of the interferential electric field is already solved, therefore, the width of the black matrix covering the data line is reduced and the light transmittance of the display substrate is improved.

FIGS. 2A-2E are schematic diagrams of another manufacturing method of a display substrate provided by an embodiment of the present disclosure, the present embodiment has the following differences from the embodiment as illustrated in FIGS. 1A-1K. In the present embodiment, the first display electrode is a common electrode, the second display electrode is a pixel electrode, and the common electrode and the drain electrode are spaced apart.

Figure 2A:
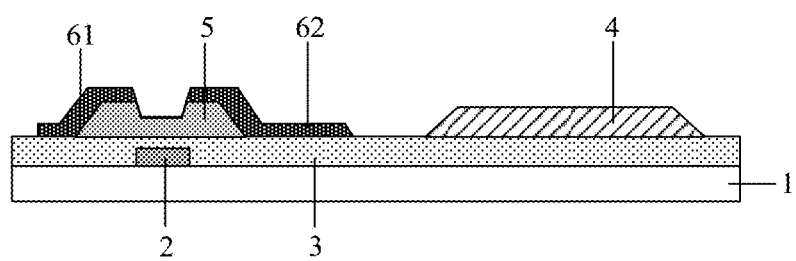
FIGS. 2A-2E are schematic diagrams of another manufacturing method of a display substrate provided by an embodiment of the present disclosure.

The steps as illustrated in FIGS. 2A-2E are performed after the steps as illustrated in FIG. 1A-1G are finished. As illustrated in FIG. 2A, the source electrode 61 and the drain electrode 62 are formed by performing a patterning process on the source-drain conductive material layer. The common electrode (i.e., the first display electrode 4) and the drain electrode 62 are spaced apart from each other.

Figure 2B:
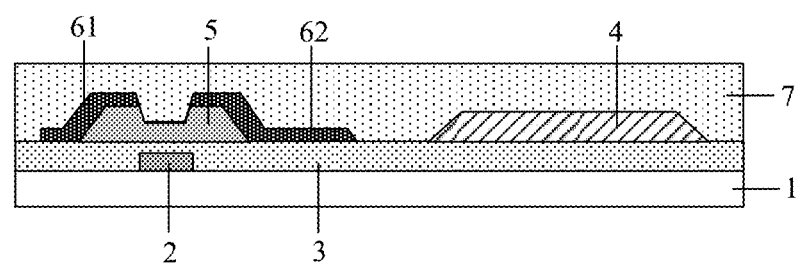

As illustrated in FIG. 2B, the first insulation layer 7 is formed, the first insulation layer 7 covers the source electrode 61, the drain electrode 62, the semiconductor layer 5 and the first display electrode 4, and the first insulation layer 7 is in direct contact with each one selected from a group consisting of the semiconductor layer 5, the drain electrode 62 and the first display electrode 4.

Figure 2C:
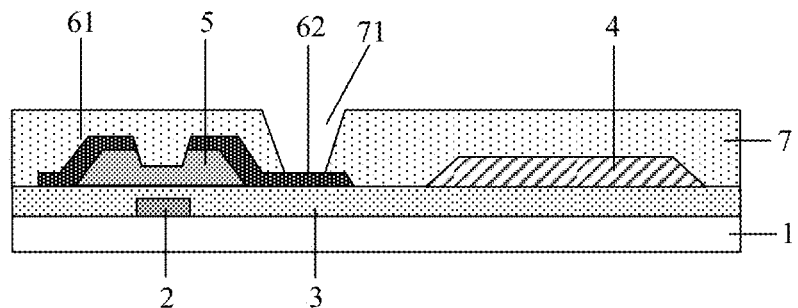

As illustrated in FIG. 2C, the manufacturing method of the display substrate further comprises: patterning the first insulation layer 7 so as to form a via hole 71 exposing the drain electrode 62.

Figure 2D:
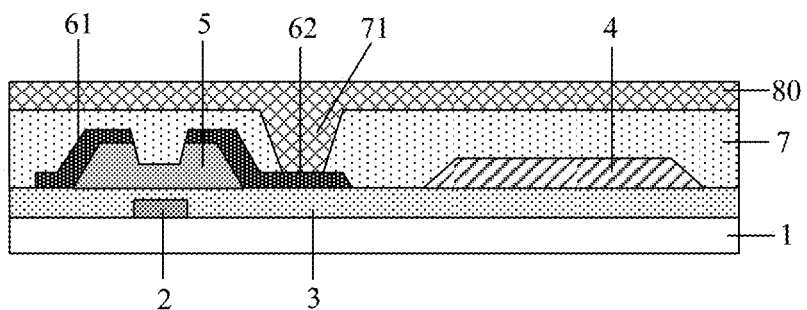

As illustrated in FIG. 2D, the second conductive material layer 80 covering the first insulation layer 7 is formed, and the second conductive material layer 80 is in contact with the drain electrode 62 via the via hole 71.

Figure 2E:
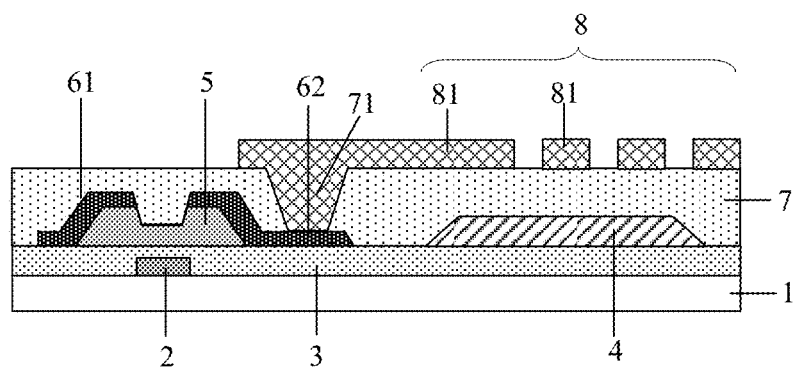

As illustrated in FIG. 2E, the second display electrode 8 is formed by performing a patterning process on the second conductive material layer 80, so as to form the display substrate as illustrated in FIG. 2E. The pixel electrode (i.e., the second display electrode 8) is electrically connected to the drain electrode 62 via the via hole 71.

During the patterning processes of the present embodiment, the wet etching method can be adopted. All the features and technical effects which are not mentioned in the present embodiment may refer to the descriptions in FIGS. 1A-1K.

In the above embodiment, the step of forming the source electrode and the drain electrode of the thin film transistor is performed after the step of forming the semiconductor layer is performed, the source electrode covers a portion of the semiconductor layer, and the drain electrode covers a portion of the semiconductor layer. In other embodiments, the step of forming the source electrode and the drain electrode of the thin film transistor may also be performed before performing the step of forming the semiconductor layer, and the semiconductor layer covers a portion of the source electrode and a portion of the drain electrode.

Figure 3A:
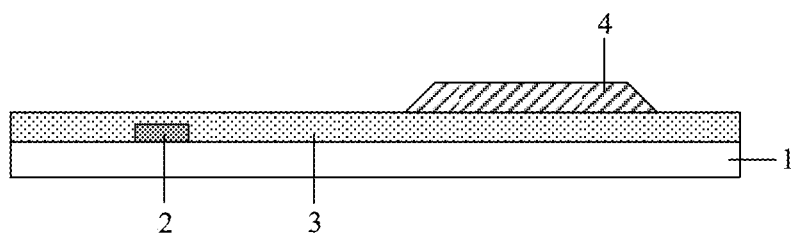
FIGS. 3A-3I are schematic diagrams of further another manufacturing method of a display substrate provided by an embodiment of the present disclosure.
Figure 3B:
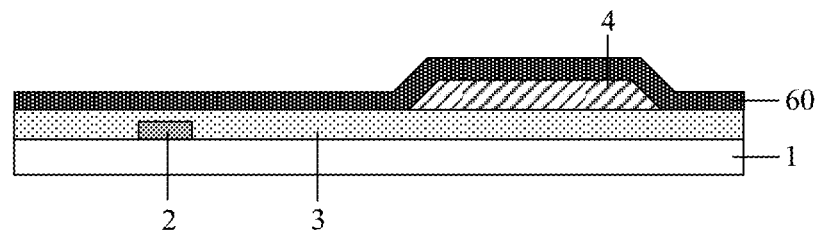
Figure 3C:
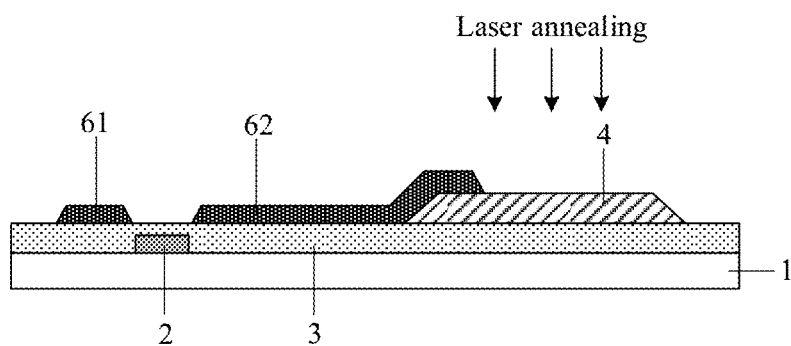

For example, FIGS. 3A-3I are schematic diagrams of further another manufacturing method of a display substrate provided by an embodiment of the present disclosure. The difference between the present embodiment and the embodiment as illustrated in FIGS. 1A-1K is in that: the step of forming the source electrode and the drain electrode of the thin film transistor is performed before performing the step of forming the semiconductor layer, and the semiconductor layer covers a portion of the source electrode and a portion of the drain electrode. In an example, the source electrode and the drain electrode are formed after the first electrode is formed and before forming the semiconductor layer. The steps as illustrated in FIG. 3A-3C is performed after the steps as illustrated in FIG. 1A-1C are finished. As illustrated in FIG. 3A, a patterning process is performed on the first conductive material layer 40 as illustrated in FIG. 1C, so as to form the first electrode 4. As illustrated in FIG. 3B, the source-drain conductive material layer 60 is formed on the gate insulation layer 3 after the first electrode 4 is formed and before forming the semiconductor layer.

As illustrated in FIG. 3C, a patterning process is performed on the source-drain conductive material layer 60 so as to form the source electrode 61 and the drain electrode 62. The present embodiment takes a case where the first display electrode is a pixel electrode and the second display electrode is a common electrode as an example; in this case, the drain electrode 62 and the first display electrode 4 are stacked with each other so that the drain electrode 62 is in direct contact with the first display electrode 4. In a stacked region, the first display electrode 4 covers a portion of the drain electrode 62. For example, before forming the semiconductor material layer, a laser annealing treatment is performed on the first display electrode 4, so that the surface of the first display electrode 4 is crystallized. During forming the semiconductor layer 5 by the wet etching method subsequently, the surface of crystallized first display electrode 4 is not easily corroded by the etching solution for etching the semiconductor material layer 50, so that the over etching of the first display electrode 4 can be avoided.

Figure 3D:
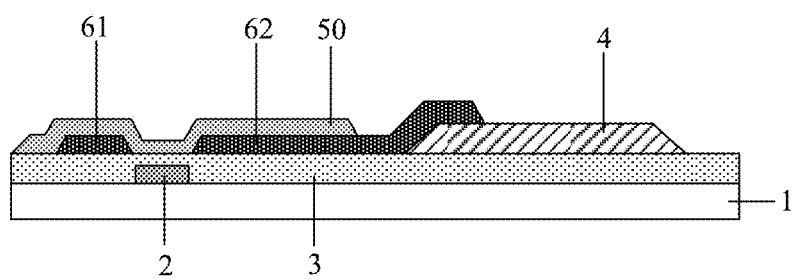

As illustrated in FIG. 3D, a semiconductor material layer 50 covering the source electrode 61 and the drain electrode 62 is formed. The semiconductor material layer 50 and the first display electrode 4 are in one same layer. Both the first display electrode 4 and a portion of the semiconductor material layer 50 are in contact with the gate insulation layer 3, so that no other layer is between the first display electrode 4 and the portion of the semiconductor material layer 50 in the direction perpendicular to the base substrate 1. The material of the semiconductor material layer 50 may be referred to the descriptions in the above embodiments.

Figure 3E:
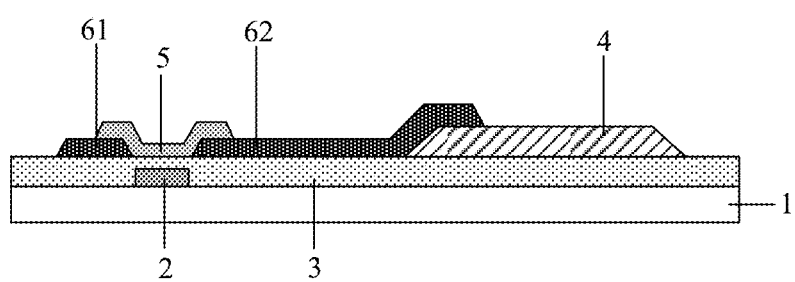

As illustrated in FIG. 3E, a patterning process is performed on the semiconductor material layer 50 so as to form the semiconductor layer 5. The semiconductor layer 5 and the first display electrode 4 are in one same layer. For example, the semiconductor layer 5 covers a portion of the source electrode 61 and a portion of the drain electrode 62. For example, in other embodiments, the semiconductor layer 5 also covers the entire source electrode 61 and a portion of the drain electrode 62.

Figure 3F:
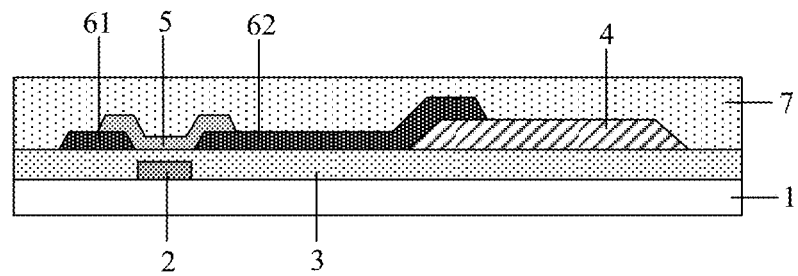

As illustrated in FIG. 3F, the first insulation layer 7 is formed, and the first insulation layer 7 covers the source electrode 61, the drain electrode 62, the semiconductor layer 5 and the first display electrode 4, and the first insulation layer 7 is in direct contact with each one selected from a group consisting of the semiconductor layer 5, the drain electrode 62 and the first display electrode 4.

Figure 3G:
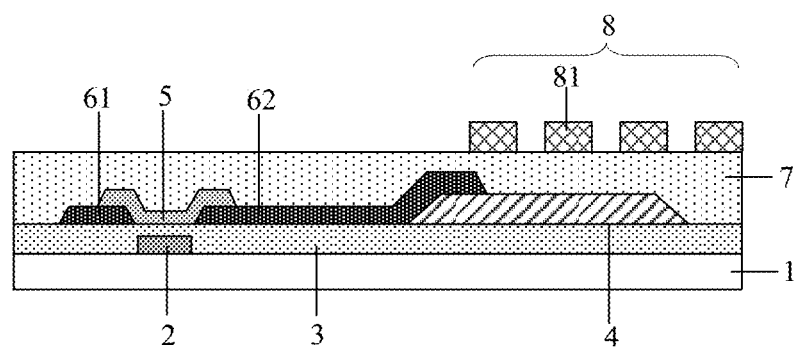

As illustrated in FIG. 3G, the second display electrode 8 is formed on the first insulation layer 7, so as to form the display substrate as illustrated in FIG. 3G The forming method and the structure features of the second display electrode 8 is the same as the embodiment as illustrated in FIGS. 1A-1K. All the patterning processes in the present embodiment may adopt the wet etching method. All the features and technical effects which are not mentioned in the present embodiment may be referred to the descriptions in FIGS. 1A-1K.

Figure 3H:
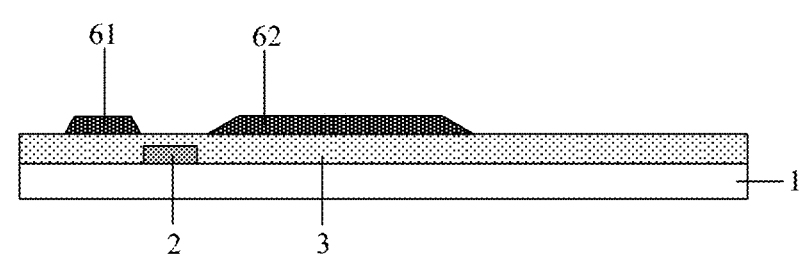
Figure 3I:
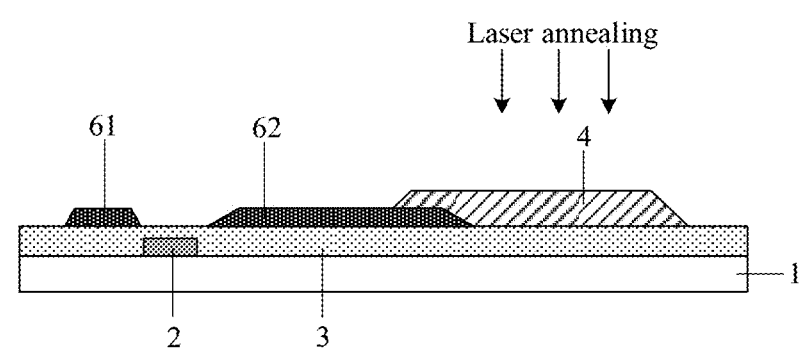

In another example of the present embodiment, the first electrode is formed after the source electrode and the drain electrode is formed and before forming the semiconductor layer. For example, after the steps as illustrated in FIGS. 1A-1B are performed, as illustrated in FIG. 3H, the source electrode 61 and the drain electrode 62 are formed on the gate insulation layer 3 by a patterning process before forming the first electrode. Then, as illustrated in FIG. 3I, the first display electrode 4 is formed by a patterning process, and the first display electrode 4 and the drain electrode 62 are stacked with each other so that the drain electrode 62 is in direct contact with the first display electrode 4. In a stacked area, the first display electrode 4 covers a portion of the drain electrode 62. Before forming the semiconductor material layer, a laser annealing treatment is performed on the first display electrode 4 so that the surface of the first display electrode 4 is crystallized. After the step as illustrated in FIG. 3I, the subsequent steps in the present example is the same as the steps as illustrated in FIGS. 3D-3F.

In the display substrates provided by the above embodiments, the thin film transistor is a bottom-gate type thin film transistor; in other embodiments, the thin film transistor may also be a top-gate type thin film transistor. For example, FIGS. 4A-4G are schematic diagrams of further another manufacturing method of a display substrate provided by an embodiment of the present disclosure. The difference between the thin film transistor manufactured in the present embodiment and the thin film transistor manufactured in the above method is in that: the thin film transistor in the display substrate is a top-gate type thin film transistor, and the step of forming the gate electrode is performed after the step of forming the semiconductor layer is performed. Detailed methods are as follows.

Figure 4A:
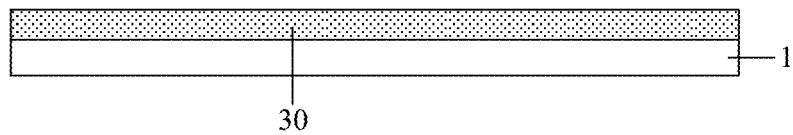
FIGS. 4A-4K are schematic diagrams of further another manufacturing method of a display substrate provided by an embodiment of the present disclosure.

As illustrated in FIG. 4A, the base substrate 1 is provided, and a bottom insulation layer 30 is formed on the base substrate 1. The bottom insulation layer 30 has a function of protecting the structure formed on the bottom insulation layer 30 and has an insulation function.

Figure 4B:
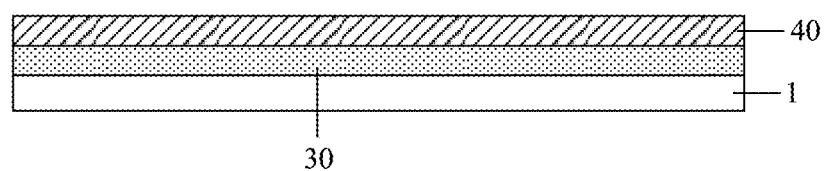

As illustrated in FIG. 4B, the first conductive material layer 40 is formed on the bottom insulation layer 30.

Figure 4C:
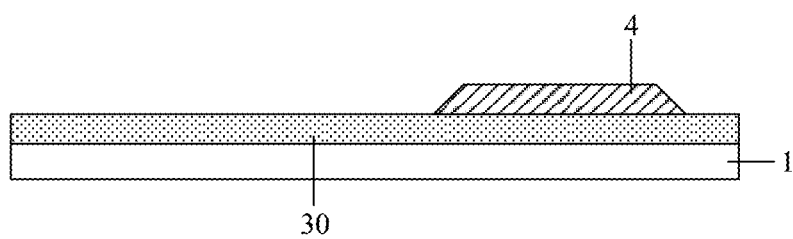

As illustrated in FIG. 4C, a patterning process is performed on the first conductive material layer 40 so as to form the first display electrode 4. The first display electrode 4 is on the bottom insulation layer 30 and is in contact with the bottom insulation layer 30.

Figure 4D:
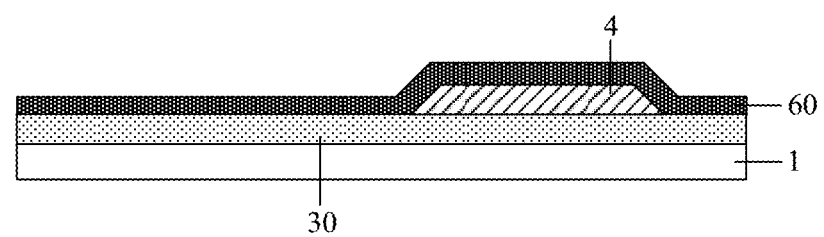

For example, before forming the semiconductor layer, the source electrode and the drain electrode of the thin film transistor are formed. As illustrated in FIG. 4D, before forming the semiconductor layer, forming the source-drain conductive material layer 60 on the bottom insulation layer 30.

Figure 4E:
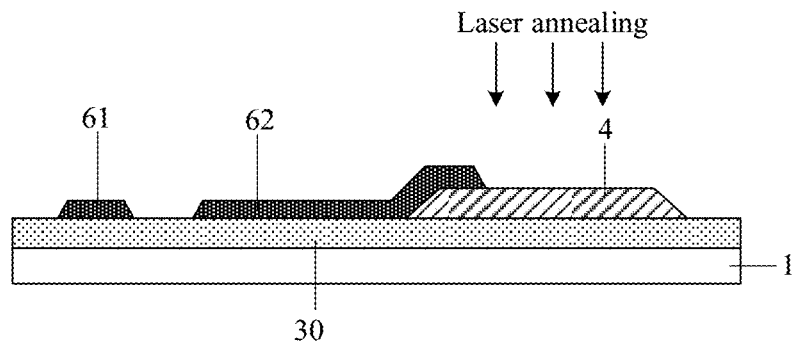

As illustrated in FIG. 4E, a patterning process is performed on the source-drain conductive material layer 60 so as to form the source electrode 61 and the drain electrode 62. The present embodiment takes the case where the first display electrode is a pixel electrode, the second display electrode is a common electrode as an example, in this case, the drain electrode 62 and the first display electrode 4 are stacked with each other so that the drain electrode 62 is in direct contact with the first display electrode 4. For example, before forming the semiconductor material layer, performing a laser annealing treatment to the first display electrode 4, so that the surface of the first display electrode 4 is crystallized. Please refer to the above-mentioned descriptions for the technical effect of crystallization.

Figure 4F:
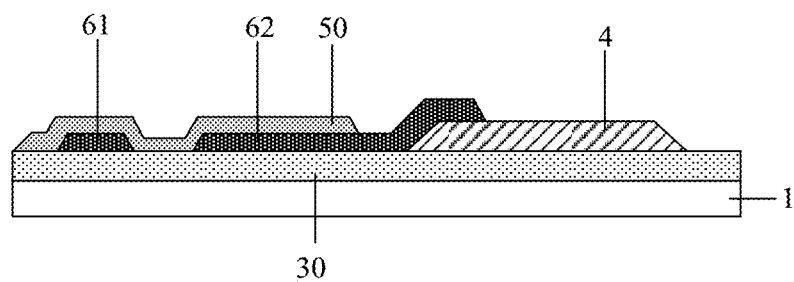

As illustrated in FIG. 4F, the semiconductor material layer 50 covering the source electrode 61 and the drain electrode 62 is formed. The semiconductor material layer 50 and the first display electrode 4 are in one same layer. Both of the first display electrode 4 and a portion of the semiconductor material layer 50 are in contact with the bottom insulation layer 30, so that no other layer is between the first display electrode 4 and the portion of the semiconductor material layer 50 in the direction perpendicular to the base substrate 1.

Figure 4G:
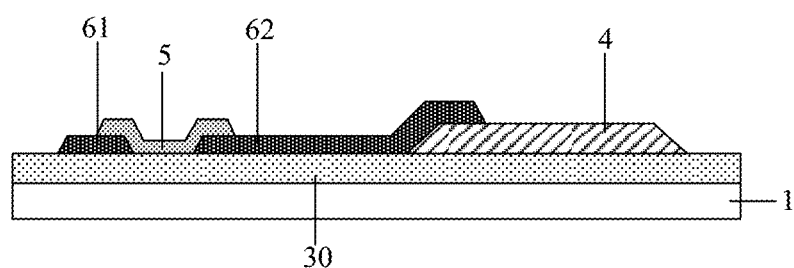

As illustrated in FIG. 4G, a patterning process is performed on the semiconductor material layer 50 so as to form the semiconductor layer 5. The semiconductor layer 5 and the first display electrode 4 are in one same layer. For example, the semiconductor layer 5 covers a portion of the source electrode 61 and a portion of the drain electrode 62. For example, in other embodiments, the semiconductor layer 5 also covers the entire source electrode 61 and a portion of the drain electrode 62.

Figure 4H:
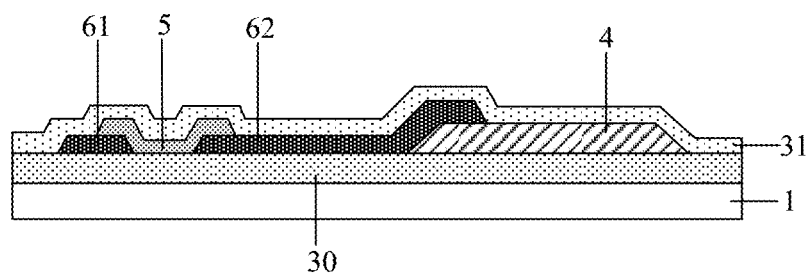

As illustrated in FIG. 4H, a gate insulation layer 31 is formed, the gate insulation layer 31 covers the source electrode 61, the drain electrode 62, the semiconductor layer 5 and the first display electrode 4, and the gate insulation layer 31 is in direct contact with each one selected from a group consisting of the semiconductor layer 5, the drain electrode 62 and the first display electrode 4. For example, a material of the gate insulation layer 31 is an inorganic insulation material (for example, silicon nitride, silicon oxide or silicon oxynitride, etc.); in this case, for example, the gate insulation layer 31 is formed by a deposition method. Of course, the material of the gate insulation layer 31 may be an organic insulation material (for example, an insulation resin material); in this case, for example, the gate insulation layer 31 is formed by a coating method.

Figure 4I:
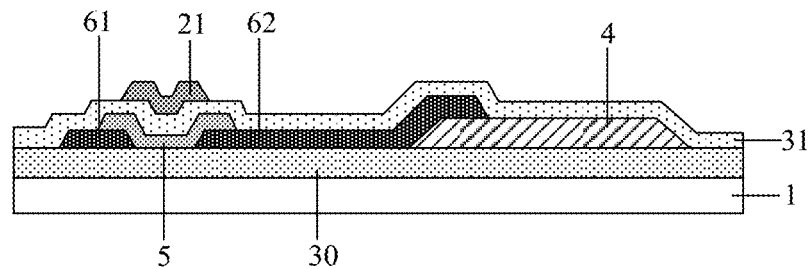

As illustrated in FIG. 4I, a gate electrode 21 is formed on the base substrate 1 by a patterning process.

Figure 4J:
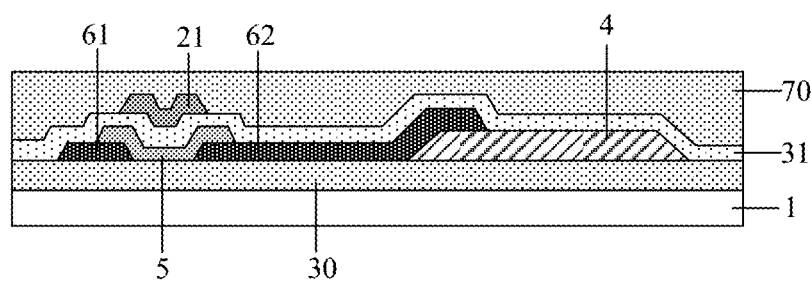

As illustrated in FIG. 4J, a first insulation layer 70 covering the gate electrode 21 and the gate insulation layer 31 is formed.

The manufacturing method of the display substrate provided by the present embodiment further comprises: forming the second insulation layer. Both the first display electrode and the semiconductor layer are formed on the second insulation layer and in contact with the second insulation layer. In the present embodiment, the second insulation layer protects the insulation layer 30.

Figure 4K:
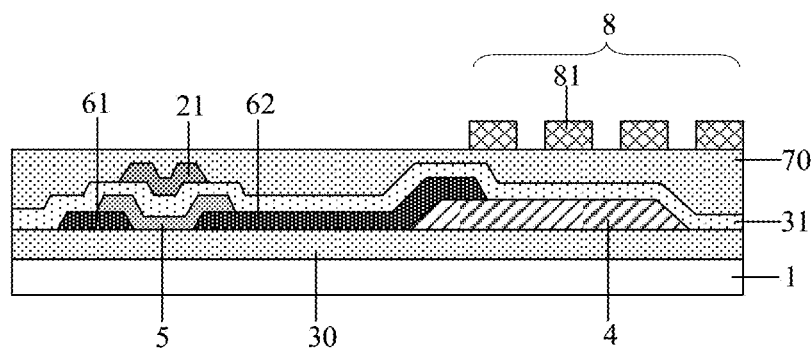

As illustrated in FIG. 4K, the second display electrode 8 is formed on the first insulation layer 70, so that the display substrate as illustrated in FIG. 4K is formed. The manufacturing method and the structure features of the second display electrode 8 is the same as the embodiment as illustrated in FIGS. 1A-1K. All the patterning processes in the present embodiment can adopt a wet etching method. All the features and technical effects which are not mentioned in the present embodiment may refer to the descriptions in FIGS. 1A-1K.

At least one embodiment of the present disclosure further provides a display substrate fabricated by any one of the manufacturing methods provided by embodiments of the present disclosure.

Figure 6A:
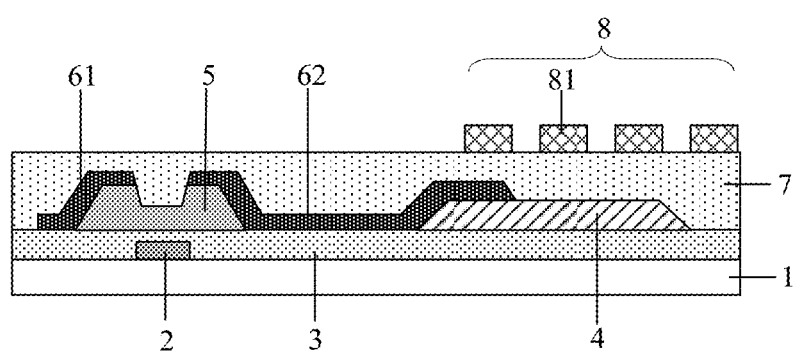
FIG. 6A is a cross-sectional view obtained along line A-A' in FIG. 5.
Figure 6B:
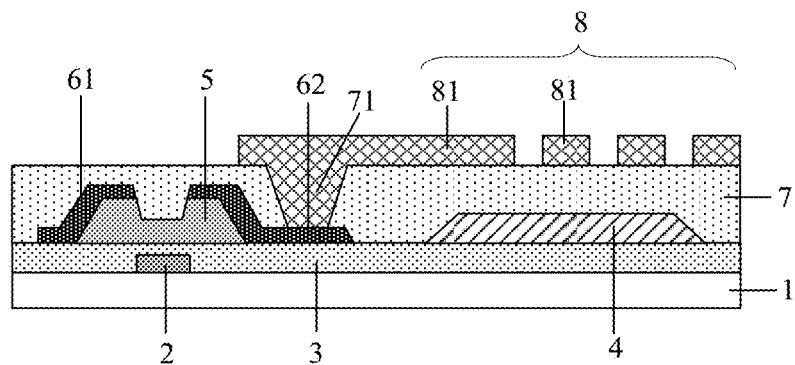
FIG. 6B is another cross-sectional view obtained along line A-A' in FIG. 5.
Figure 6C:
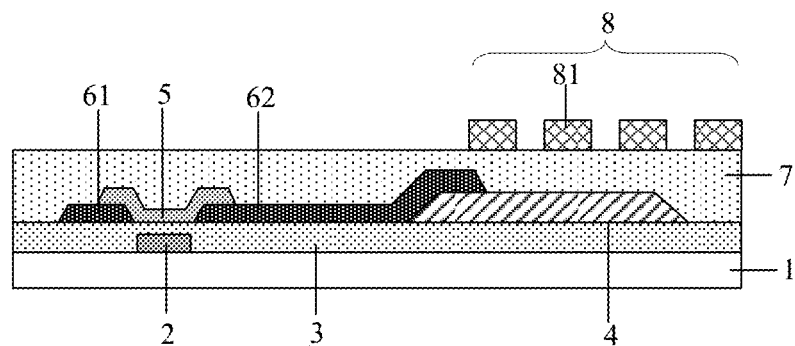
FIG. 6C is further another cross-sectional view obtained along line A-A' in FIG. 5.
Figure 6D:
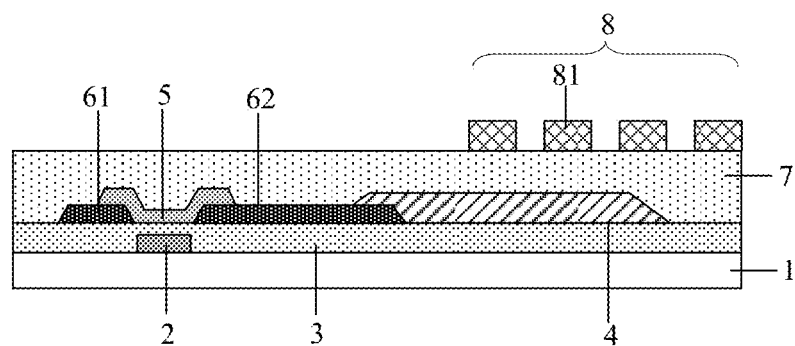
FIG. 6D is further another cross-sectional view obtained along line A-A' in FIG. 5.
Figure 6E:
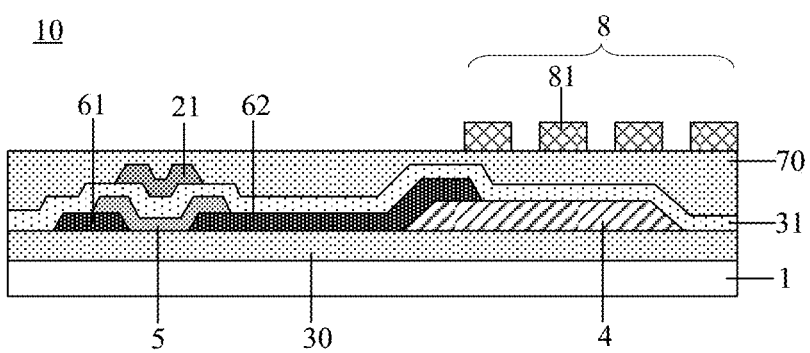
FIG. 6E is further another cross-sectional view obtained along line A-A' in FIG. 5.

Exemplarily, FIG. 5 is a schematically plan view of a display substrate fabricated by a manufacturing method of a display substrate provided by an embodiment of the present disclosure. FIG. 6A is a cross-sectional view along line A-A' in FIG. 5, FIG. 6B is another cross-sectional view along line A-A' in FIG. 5, FIG. 6C is further another cross-sectional view along line A-A' in FIG. 5; FIG. 6D is further another cross-sectional view along line A-A' in FIG. 5; FIG. 6E is further another cross-sectional view along line A-A' in FIG. 5. The display substrate as illustrated in FIG. 6A is fabricated by the method as illustrated in FIGS. 1A-1K; the display substrate as illustrated in FIG. 6B is fabricated by the method as illustrated in FIGS. 2A-2E; the display substrates as illustrated in FIG. 6C and FIG. 6D are fabricated by the method as illustrated in FIGS. 3A-3H; the display substrate as illustrated in FIG. 6E is fabricated by the method as illustrated in FIGS. 4A-4K.

As illustrated in FIG. 6A, the display substrate 10 comprises: the first display electrode 4 and the thin film transistor; the thin film transistor comprises the semiconductor layer 5. The first display electrode 4 and the semiconductor layer 5 are in one same layer. In a common display substrate, in the direction perpendicular to the base substrate 1, at least one other layer is between the first display electrode 4 and the semiconductor layer 5. The at least one other layer is, for example, an insulation layer covering the semiconductor layer 5 so as to protect the semiconductor layer 5. Therefore, compared with the common display substrate, the structure of the display substrate provided by an embodiment of the present disclosure is simplified, and this is in favor of simplifying the manufacturing process of the display substrate, improving a production efficiency, and reducing a production cost.

For example, as illustrated in FIG. 6A, the display substrate 10 further comprises: the source electrode 61 and the drain electrode 62 of the thin film transistor, the first insulation layer 7 and the second display electrode 8. The source electrode 61 and the drain electrode 62 are respectively electrically connected to the semiconductor layer 5. The first insulation layer 7 covers the source electrode 61, the drain electrode 62, the semiconductor layer 5 and the first display electrode 4, and the first insulation layer 7 is in direct contact with each one selected from a group consisting of the semiconductor layer 5, the drain electrode 62 and the first display electrode 4. The second display electrode 8 is on the first insulation layer 7. Compared with the usual display substrate, the number of film layers in the display substrate provided by an embodiment of the present disclosure is reduced; for example, the number of the insulation layers is reduced. For example, in the display substrate 10 as illustrated in FIG. 6A, the source electrode 61 and the drain electrode 62 respectively cover a portion of the semiconductor layer.

For example, the material of the semiconductor layer 5 is metal oxide, and the metal oxide is, for example, indium gallium zinc oxide (IGZO), for example, indium gallium zinc amorphous oxide. Obviously, the material of the semiconductor layer 5 is not limited to the types listed above. Please refer to the above-mentioned descriptions for the technical effect which is realized by allowing the material of the semiconductor layer 5 to be the metal oxide, and no further description is given here. For example, the material of the first display electrode 4 is transparent metal oxide, and the transparent metal oxide is indium tin oxide (ITO), indium zinc oxide (IZO), etc.

For example, in FIG. 6A, the first display electrode 4 is a pixel electrode, and the second display electrode 8 is a common electrode. The pixel electrode and the drain electrode 62 are stacked with each other so that the pixel electrode is in direct contact with the drain electrode 62, so as to reduce the contact resistance between the pixel electrode and the drain electrode 62.

For example, with reference to FIG. 5 and FIG. 6A, the display substrate 10 further comprises: the data line which is electrically connected to and in one same layer as the source electrode 61. The second display electrode 8 covers at least a portion of the data line. For example, the second display electrode 8 cover the entire width of the data line 9 along the width direction (which is perpendicular to the extension direction of the data line 9) of the data line 9. When using the display substrate to fabricate and form a liquid crystal display panel, because the second display electrode 8 covers a portion of the data line 9, so that the interferential electric field generated by charges on the data line can be shielded, in which the interferential electric field can cause interference to the rotation of the liquid crystal. Generally, a black matrix covering the data line is provided in the liquid crystal display panel. The black matrix not only can block light, but also can shield the above-mentioned interferential electric field. Because the second display electrode covers at least a portion of the data line, the issue of the interferential electric field is already solved, so that the width of the black matrix covering the data line is reduced and the light transmittance of the display substrate is improved. For example, the data line and the source electrode are integrally formed. The above-mentioned integrally formed means that: the materials of the data line and the source electrode are the same, the data line and the source electrode are simultaneously formed in the same patterning process, and no seam is between the data line and the source electrode.

For example, the second display electrode 8 is a slit electrode, and the first display electrode 4 is a plate electrode. The electric field generated at the edge of the slit electrode and the electric field generated between the slit electrode and the plate electrode can form a multidimensional electric field. When using the display substrate to fabricate a liquid crystal panel, liquid crystal molecules, with all kinds of orientation, which are between the slit electrodes and right above the electrode are allowed to rotate, so that the liquid crystal working efficiency and the light transmission efficiency are increased.

The difference between the display substrate 10 as illustrated in FIG. 6B and the display substrate as illustrated in FIG. 6A is in that: the first display electrode 4 is a common electrode, and the second display electrode 8 is a pixel electrode. The common electrode and the drain electrode 62 are spaced apart from each other. The first insulation layer 7 comprises the via hole 71 exposing the drain electrode 62, and the pixel electrode is electrically connected to the drain electrode 62 via the via hole 71. Both of the other structures and technical effect of the display substrate 10 are the same as that of FIG. 6A, please refer to the above-mentioned descriptions.

The difference between the display substrate 10 as illustrated in FIG. 6C and the display substrate as illustrated in FIG. 6A is in that: the semiconductor layer 5 covers a portion of the source electrode 61 and a portion of the drain electrode 62. Both of the other structures and technical effect of the display substrate 10 are the same as that of FIG. 6A, please refer to the above-mentioned descriptions.

The difference between the display substrate 10 as illustrated in FIG. 6D and the display substrate as illustrated in FIG. 6A is in that: in FIG. 6D, in the region where the first display electrode 4 and the drain electrode 62 are stacked with each other, the drain electrode 62 covers a portion of the first display electrode 4; in FIG. 6D, in the region where the first display electrode 4 and the drain electrode 62 are stacked with each other, the first display electrode 4 covers a portion of the drain electrode 62.

The difference between the display substrate 10 as illustrated in FIG. 6E and the display substrate as illustrated in FIG. 6A is in that: in the display substrate 10 as illustrated in FIG. 6A, the thin film transistor is a bottom-gate type thin film transistor; in the display substrate 10 as illustrated in FIG. 6E, the thin film transistor is a top-gate type thin film transistor. Please refer to the above-mentioned descriptions for the other structures and technical effect of the display substrate 10.

At least one embodiment of the present disclosure further provides a display device, and the display device comprises any one of the display substrates provided by embodiments of the present disclosure.

Figure 7:
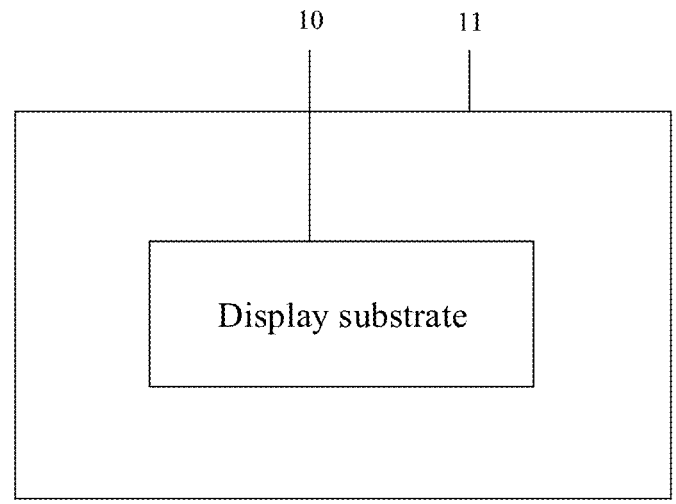
FIG. 7 is a schematic diagram of a display device provided by an embodiment of the present disclosure.

FIG. 7 is a schematic diagram of a display device provided by an embodiment of the present disclosure. The display device 11 provided by an embodiment of the present disclosure comprises any one of the display substrates 10 provided by embodiments of the present disclosure. For example, the display device 11 is a liquid crystal display device. For example, the display device 11 may be implemented as the following products: a product or a component that has a display function, such as a cell phone, a tablet computer, a display, a laptop, a notebook computer, an ATM machine.

Figure 8:
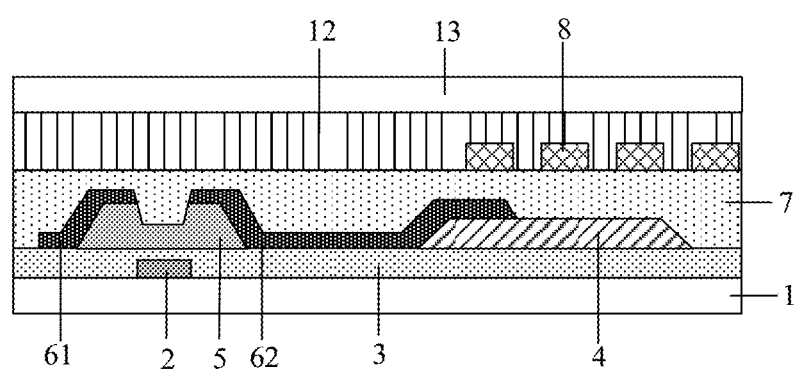
FIG. 8 is a schematic structural diagram of a display panel in a display device provided by an embodiment of the present disclosure.

For example, the display device 11 comprises a display panel, and the display panel comprises the display substrate 10. FIG. 8 is a schematically structural diagram of the display panel in a display device provided by an embodiment of the present disclosure. As illustrated in FIG. 8, the display panel comprises any one of the display substrates 10 provided by embodiments of the present disclosure, a liquid crystal layer 12 and an opposite substrate 13. The liquid crystal layer 12 is between the display substrate 10 and the opposite substrate 13, and the second display electrode 8 faces toward the liquid crystal layer. The liquid crystals in the liquid crystal layer are configured to rotate under the action of the electrical field formed by the first display electrode 4 and the second display electrode 8. The electrical field comprises the electrical field formed by the second display electrode 8 and the first display electrode 4 which is opposite to the second display electrode 8, and comprises a fringe electric field formed by the second display electrode 8.

What are described above is related to the illustrative embodiments of the disclosure only and not limitative to the scope of the disclosure; the scopes of the disclosure are defined by the accompanying claims.

What is claimed is:

1. A manufacturing method of a display substrate, comprising:
   forming a first display electrode; and
   forming a thin film transistor, which comprises forming a semiconductor layer,
   wherein a step of forming the first display electrode is performed before performing a step of forming the semiconductor layer; a material of the semiconductor layer is a metal oxide semiconductor material, and a material of the first display electrode is a transparent metal oxide material; and
   the manufacturing method further comprises:
   before forming the semiconductor layer, forming a transparent metal oxide material layer using the transparent metal oxide material, and performing a patterning process on the transparent metal oxide material layer to form the first display electrode; and
   before forming the semiconductor layer, preforming a laser annealing treatment on the first display electrode to enable at least a surface of the first display electrode to be crystallized;
   after the at least the surface of the first display electrode is crystallized, forming a semiconductor material layer using the metal oxide semiconductor material, wherein the semiconductor material layer exposes at least part of the surface of the first display electrode; and
   performing a patterning process on the semiconductor material layer using a wet etching method to etch the semiconductor material layer so as to form the semiconductor layer.

2. The manufacturing method of the display substrate according to claim 1,
   wherein the semiconductor material layer and the first display electrode are in one same layer, and the first display electrode and the semiconductor layer are in one same layer.

3. The manufacturing method of the display substrate according to claim 2, further comprising:
   forming a source electrode and a drain electrode of the thin film transistor, wherein the source electrode and the drain electrode are respectively electrically connected to the semiconductor layer;
   forming a first insulation layer, wherein the first insulation layer covers the source electrode, the drain electrode, the semiconductor layer and the first display electrode, and the first insulation layer is in direct contact with each one selected from a group consisting of the semiconductor layer, the drain electrode and the first display electrode; and
   forming a second display electrode on the first insulation layer.

4. The manufacturing method of the display substrate according to claim 3, further comprising:
   forming a data line, wherein the data line is electrically connected to the source electrode and is in one same layer with the source electrode; the second display electrode covers at least a portion of the data line.

5. The manufacturing method of the display substrate according to claim 3, wherein the second display electrode is a slit electrode, and the first display electrode is a plate electrode.

6. The manufacturing method of the display substrate according to claim 3, wherein
   the first display electrode is a pixel electrode, and the second display electrode is a common electrode; and
   a step of forming the source electrode and the drain electrode of the thin film transistor comprises:
   forming a source-drain conductive material layer; and
   performing a patterning process on the source-drain conductive material layer so as to form the source electrode and the drain electrode, wherein a portion of the pixel electrode and a portion of the drain electrode are stacked with each other so that the pixel electrode and the drain electrode are in direct contact with each other.

7. The manufacturing method of the display substrate according to claim 3, wherein
   the first display electrode is a common electrode, and the second display electrode is a pixel electrode;
   a step of forming the source electrode and the drain electrode of the thin film transistor comprises:
   forming a source-drain conductive material layer; and
   performing a patterning process on the source-drain conductive material layer so as to form the source electrode and the drain electrode, wherein the common electrode and the drain electrode are spaced apart from each other; and the manufacturing method of the display substrate further comprises:

patterning the first insulation layer so as to form a via hole exposing the drain electrode, wherein the pixel electrode is electrically connected to the drain electrode by the via hole.

8. The manufacturing method of the display substrate according to claim 3, wherein a step of forming the source electrode and the drain electrode of the thin film transistor is performed after performing the step of forming the semiconductor layer, the source electrode covers a portion of the semiconductor layer, and the drain electrode covers a portion of the semiconductor layer; or, the step of forming the source electrode and the drain electrode of the thin film transistor is performed before performing the step of forming the semiconductor layer, and the semiconductor layer covers a portion of the source electrode and a portion of the drain electrode.

9. The manufacturing method of the display substrate according to claim 1, further comprising: forming a second insulation layer, wherein both the first display electrode and the semiconductor layer are formed on the second insulation layer, and are in direct contact with the second insulation layer.

* * * * *